United States Patent [19]
Villa et al.

[11] Patent Number: 5,886,949
[45] Date of Patent: Mar. 23, 1999

[54] METHOD AND CIRCUIT FOR GENERATING A SYNCHRONIZING ATD SIGNAL

[75] Inventors: Corrado Villa, Sovico; Marco Defendi, Sulgiate; Luigi Bettini, Cavenago Brianza, all of Italy

[73] Assignee: SGS-Thomson Microelectronics, S.r.l., Agrate Brianza, Italy

[21] Appl. No.: 978,665

[22] Filed: Nov. 26, 1997

[30] Foreign Application Priority Data

Nov. 27, 1996 [EP] European Pat. Off. .............. 96830598

[51] Int. Cl.⁶ ...................................................... G11C 7/00
[52] U.S. Cl. ........................ 365/233.5; 365/202; 365/194
[58] Field of Search .................................... 365/194, 202, 365/233, 233.5

[56] References Cited

U.S. PATENT DOCUMENTS

| | | | |
|---|---|---|---|
| 5,323,359 | 6/1994 | Kayamoto et al. ................... | 365/233.5 |
| 5,418,479 | 5/1995 | Sambandan ................................ | 326/93 |
| 5,479,374 | 12/1995 | Kobayashi et al. ................... | 365/233.5 |
| 5,487,043 | 1/1996 | Furutani et al. ........................ | 365/203 |
| 5,719,820 | 2/1998 | Fuji ...................................... | 365/233.5 |

*Primary Examiner*—David Nelms
*Assistant Examiner*—Son Mai
*Attorney, Agent, or Firm*—David V. Carlson; Seed and Berry LLP

[57] ABSTRACT

A method and a circuit generates a pulse synchronization signal in order to control the reading phase of memory cells in semiconductor integrated, electronic memory devices. The pulse synchronization signal is generated upon sensing a change in logic state on at least one of a plurality of address input terminals of the memory cells to also generate an equalization signal for a sense amplifier. The logic state of said pulse synchronization signal is re-acknowledged by a fed-back response having a predetermined delay and being generated upon reception of a corresponding signal to said equalization signal. To this aim, a re-acknowledge circuit portion is provided which is input a corresponding signal to the equalization signal and feedback connected to the output node to drive the discharging of the node with a predetermined delay from the reception of the input signal.

20 Claims, 5 Drawing Sheets

METHOD AND CIRCUIT FOR GENERATING A SYNCHRONIZING ATD SIGNAL

TECHNICAL FIELD

This invention relates to a method and to a circuit for generating an Address Transition Detection ATD pulse synchronization signal in order to control the reading phase of memory cells in semiconductor integrated, electronic memory devices.

BACKGROUND OF THE INVENTION

As is well known, reading the contents of cells in a semiconductor integrated electronic memory device is possible by means of a predetermined sequence of operations referred to in the art as the reading cycle.

A reading cycle begins with the memory address of data to be read being presented to the input terminals of the memory circuit. An input stage detects a change in the status of the addresses present on such terminals to thereby initiate a reading operation.

Row and column decoder circuits select the memory word that has been addressed.

The states of the cells contained in this memory word are sensed by a read amplifier, commonly referred to as the sense amplifier. The data sensed by the sense amplifier is then output through an output buffer stage.

Each of the above reading cycle phases must have a predetermined duration and be compatible with the memory access times set up by the memory circuit specifications.

All of the various phases of a reading cycle are clocked by synchronization pulses derived from a single main pulse referred to as the ATD (Address Transition Detection) pulse. The ATD pulse is generated within the memory circuit each time that a switching of address is sensed on the input terminals.

In general, the generation of the ATD pulse is entrusted to a NOR structure whose output is normally at a high logic level.

On the occurrence of a change in logic level, even at just one of the input terminals, the NOR structure will switch its output to allow a terminal, from which the ATD pulse is delivered, to be discharged to ground.

The accompanying FIG. 1 depicts schematically circuitry for generating the ATD signal, in accordance with a first prior art structure.

FIG. 1 shows circuitry 1 which comprises a plurality of input buffer stages 2 each associated with a respective one of a plurality of address input terminals. The input terminals are designated PAD<0>, . . . , PAD<9>.

Each of the input buffer stages 2 has at least one buffered output 3, that is, an output delivering a signal buff-inp which is essentially a delayed replica of the signal present on the corresponding PAD. The structure shown in FIG. 1 is referred to as a concentrated NOR because all the outputs 3 of the stages 2 are connected to a single ATD pulse generating circuit 4 which implements a logical NOR function. The NOR circuitry 1 has an output 5 that delivers the ATD pulse as discussed below.

The ATD pulse generating circuit 4 has an output node 8 that presents an ATD signal and is coupled to an inverter 9 which outputs the ATD pulse at the output 10 of the NOR circuitry 1. The output node 8 is connected by a resistor R to a power supply Vcc and by a capacitor C to ground.

This NOR circuitry I always has at least one of its input terminals at a high logic level, such that its output 10 can be low whenever in a static condition. Therefore, the ATD signal (ATD _Line) will be normally high and an upward ATD pulse will originate from a downward transition of the ATD signal due to the inverter 9.

As previously mentioned, the ATD pulse would only be generated on the occurrence of a transition in the logic state of one of the input terminals PAD<0>, . . . , PAD<9>. The accompanying FIG. 2 depicts schematically the structure of the ATD pulse generating circuit 4 for generating the ATD signal.

The ATD pulse generating circuit 4 comprises P-channel MOS transistors, designated M2, M4 and M7, which are highly resistive and, therefore. hardly conductive. The transistor M7 has its gate connected to ground, and thus, is always ON and holds the output node 8 of the circuit 4 at a high logic level, in cooperation with a stabilizing capacitor C1.

The transistors M2 and M4 are pull-up elements for respective CMOS inverters formed with corresponding pull-down NMOS transistors M3 and M5. The structure which results from the coupling of the inverters M2, M3 and M4, M5 is that of a latching register 11 which has outputs, Q and $\overline{Q}$, the Q output being normally at a high logic level and the $\overline{Q}$ output being at a low logic level.

The ATD pulse generating circuit 4 also includes two highly conductive NMOS transistors M1, M6 coupled to one of the buff-inp signals output from one of the input buffer stages 2. A control gate of the transistor M1 receives the buff-inp signal directly while a control gate of the transistor M6 receives an inverted buff-inp signal from an inverter I, the ATD pulse generating circuit 4 also includes capacitors C2 and C3, which stabilizes the output signals Q, $\overline{Q}$.

In addition, the ATD pulse generating circuit 4 includes a logical NOR gate 13 that receives as inputs the output signals Q, $\overline{Q}$ from the latch 11. During steady state, one of the output signals Q, $\overline{Q}$ will be that a high logic level, which causes the output of the NOR gate 13 to be at a low logic level. The low logic output of the NOR gate 13 to be at a low logic level. The low logic level fails to turn on an NMOS transistor M8 coupled between the output node 8 and ground. As a result, the ATD signal at the output node 8 remains at a high logic level.

On the occurrence of a transition of the input signal buff-inp from a high logic level to a low one, the first output, $\overline{Q}$, of the latching inverter 11 is brought to a low logic level very quickly because MOS transistor M6 is highly conductive. The other output, Q, will take a little more time to change its state because the pull-up transistors M2 and M4 are highly resistive. Thus there will be a time when both these outputs are Q, $\overline{Q}$ at a low logic level.

With the Q and $\overline{Q}$ outputs connected directly to respective inputs of the NOR gate 13, the output of the NOR gate 13 will be driven to a high logic value, thereby turning ON the NMOS transistor M8.

Turning ON the transistor M8 enables discharging of the current through the transistor M7 to ground, consequently changing the ATD signal at the output node 8 to a low logic value effective to produce the ATD pulse.

The structure just described is duplicated in the ATD pulse generated circuit 4 at each of the input terminals; only the transistor M7 of the output node 8 and its capacitor C1 are shared by the entire circuit 4, and correspond respectively to the resistor R and the capacitor C shown in FIG. 1. Accordingly, whenever any of the input signal buff-inp changes state, the current through the transited M7 as grounded, which produces an ATD pulse.

While being in many ways advantageous and substantially achieving its objective, the generator circuit previously described has certain drawbacks, as specified herein below.

A stable duration for the ATD pulse cannot always be ensured on the occurrence of spurious switching pulses (noise) at the address input terminals.

This has an adverse effect on the memory access times because the circuit will also generate an ATD pulse in the presence of noise, but this short-duration pulse does not allow a correct reading of data from the memory.

A second known solution, depicted schematically in FIG. 3, provides for the association, with each input terminal PAD, of an input buffer stage 5 which also incorporates a portion of the foregoing ATD pulse generating circuit.

According to this prior solution, referred to in the art as the distributed NOR, each input buffer stage 5 is provided with a control output 6 whereat an ATD signal is developed. All the outputs 6 of the buffer stages 5 are connected to a single line 7, ATD-LINE, which is normally implemented as a metallization line running up to the output node 8. The output node 8 is also connected to the power supply Vcc through the resistor R and to the ground GND through the capacitor C.

A pulse ATD-PULSE is obtained from the output node 8 by the inverter 9, as in the example of FIG. 1.

When a logic level transition occurs on one of the input terminals PAD, the corresponding control output 6 is able to bias the line ATD-LINE 7 to ground. Being comparatively long, the line 7 has a resistance and intrinsic capacitance of relatively high value. Accordingly, if the switching affects all the addresses in parallel, the line 7 will be discharged quite rapidly. Otherwise, if the switching only affects the farthest PAD from the output node 8, the line 7 will be discharged at a slower rate.

This prior structure shows, therefore, to be dependent on the number of the switched addresses. In fact, where the switching involves those address terminals which are physically the farthest, the circuit undergoes a delay due to the length of the metallization paths. This reflects on the stability of the ATD pulse duration in an adverse manner.

In practice, a different duration is obtained for the equalization period according to which terminal is being switched, and this worsen the memory access time during the reading phase.

An underlying technical problem of the instant invention is to provide a method and a circuit for generating an ATD signal, which have such respective functional and structural features as to obviate the drawbacks that are besetting the solutions offered by the prior art.

SUMMARY OF THE INVENTION

An embodiment of the instant invention provides for a re-acknowledgment of the logic state of an ATD pulse signal using a fed-back response having a predetermined time delay and being generated upon reception of a signal which corresponds to an equalization signal EQLZ derived from the ATD signal for a sense amplifier.

An embodiment of the present invention is directed to a circuit for generating an ATD pulse synchronization signal to control the reading phase of memory cells of semiconductor integrated electronic memory devices. The circuit is of the type which is linked operatively to the occurrence of a change in logic state on at least one of a plurality of address input terminals of said memory cells. The circuit comprises a structure of the NOR type placed between said address terminals and an output node whence an equalization signal is obtained for a sense amplifier. The circuit is characterized in that it comprises a re-acknowledge circuit portion which is input a signal corresponding to said equalization signal and is feedback connected to said output node to drive the discharging of the node with a predetermined delay from the reception of the input signal.

The features and advantages of the method and circuit according to the invention will be apparent from the following detailed description of an embodiment thereof, given by way of non-limitative example with reference to the accompanying drawings.

DETAILED DESCRIPTION

Figure 4:
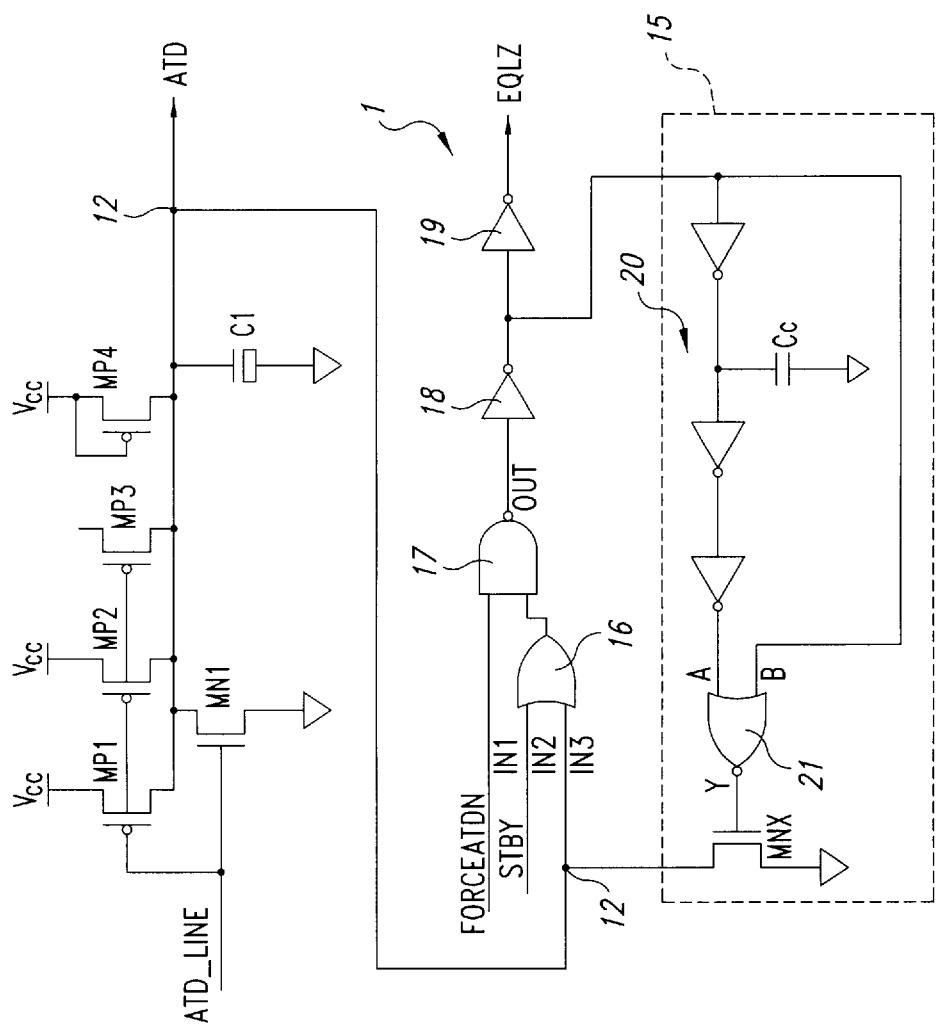
FIG. 4 shows schematically the generator circuit of this invention.

Referring to the drawing figures, and in particular to the example in FIG. 4, generally and schematically shown at 13 is a generator circuit according to the invention for generating an ATD (Address Transition Detection) signal for use during a memory cell reading cycle.

Memory cells may include a plurality of memory elements incorporated into a conventional electronic device integrated on a semiconductor and implemented with a matrix of cells organized in rows and columns. Associated with the matrix are corresponding row and column decoder circuit portions, and sense amplifiers.

The memory cells may be any types; however, for the purpose of this embodiment of the invention, they are preferably of the FLASH EPROM non-volatile type adapted to be programmed and erased electrically.

To fully appreciate aspects of this invention, it should be recalled that the phase of reading such memory cells comprises a cycle of operations which are clocked by synchronization pulses derived from a single main pulse designated ATD.

That circuit portion which is to read the contents of the memory cells and convert the read analog data to digital data is called the sense amplifier or read amplifier. This amplifier is usually of the differential type and has a pair of inputs which are respectively connected to a cell of the memory matrix and to a reference cell. The reading is made possible by an unbalance in the loads of a matrix leg Matside and a reference leg Rifside.

The prior art teaches carrying out an equalization phase for the potential present on said two legs connected to the amplifier inputs, before each reading phase that involves an unbalance of the two legs.

The equalization is allowed by a suitable circuit, not shown because conventional, being driven by an equalization signal EQLZ.

For the purpose of this invention, it is relevant that the equalization signal EQLZ is derived from the ATD signal through a set of logic gates, as explained hereinafter.

The generator circuit 13 comprises P-channel MOS transistors which are connected in parallel with one another, and denoted by MP1, MP2 and MP3. These transistors are connected between a positive first voltage supply reference Vcc and an ATD output node 12. Of course, other types of transistors could be employed, such as bipolar transistors and N-channel MOS transistors.

Figure 1:
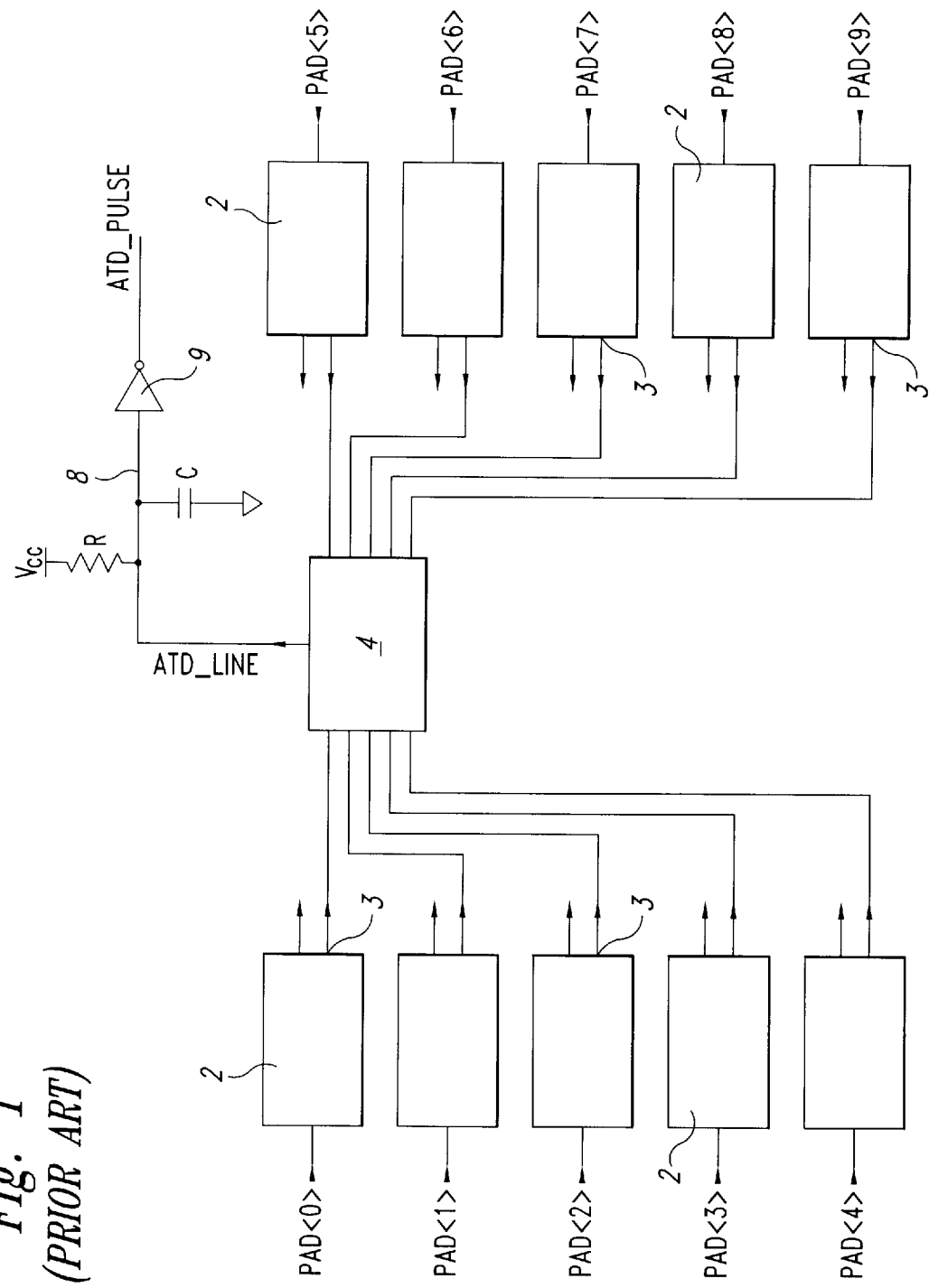
FIG. 1 shows schematically a prior art circuit for generating an ATD pulse signal.
Figure 2:
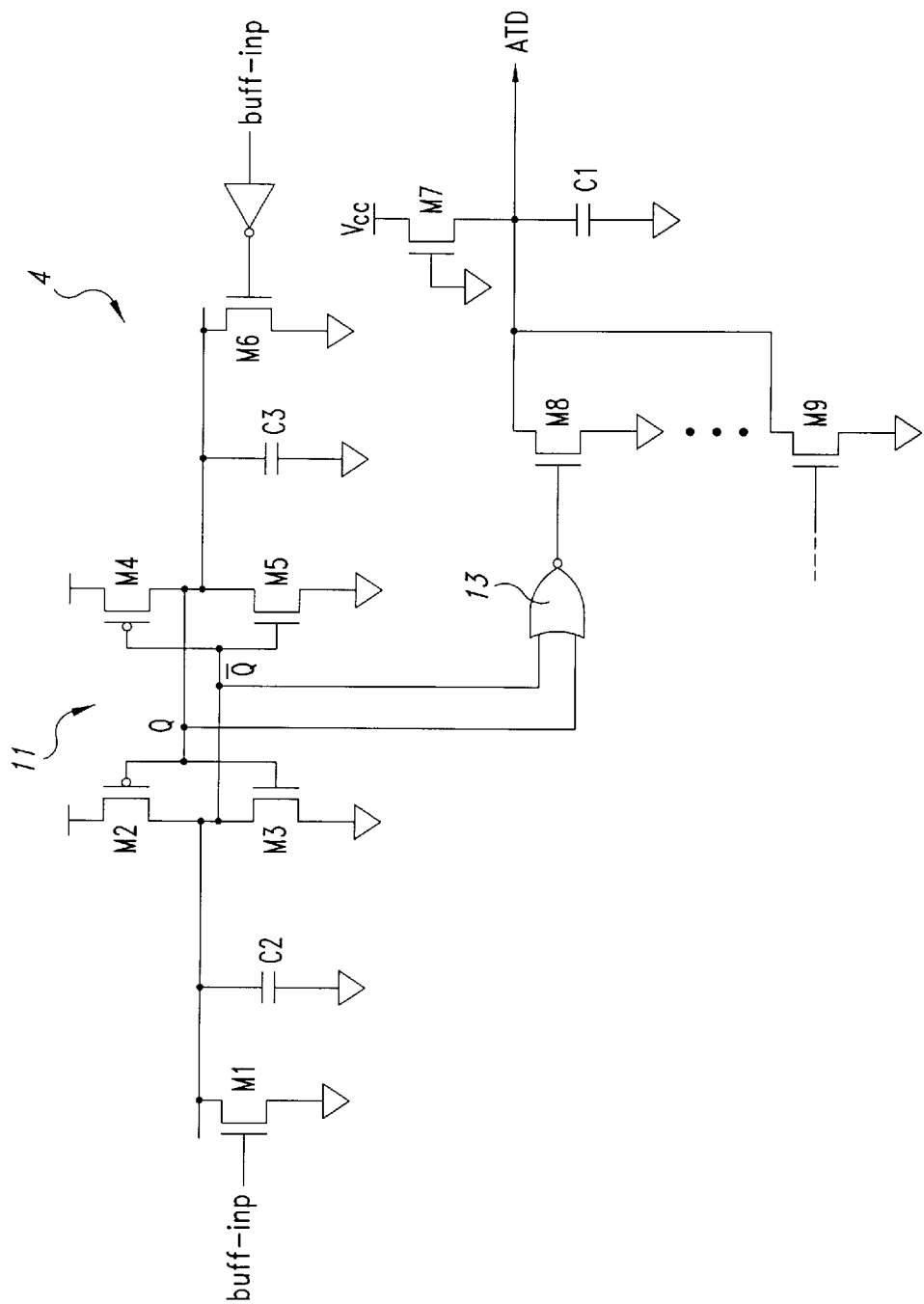
FIG. 2 is a schematic detail view of the circuit shown in FIG. 1.
Figure 3:
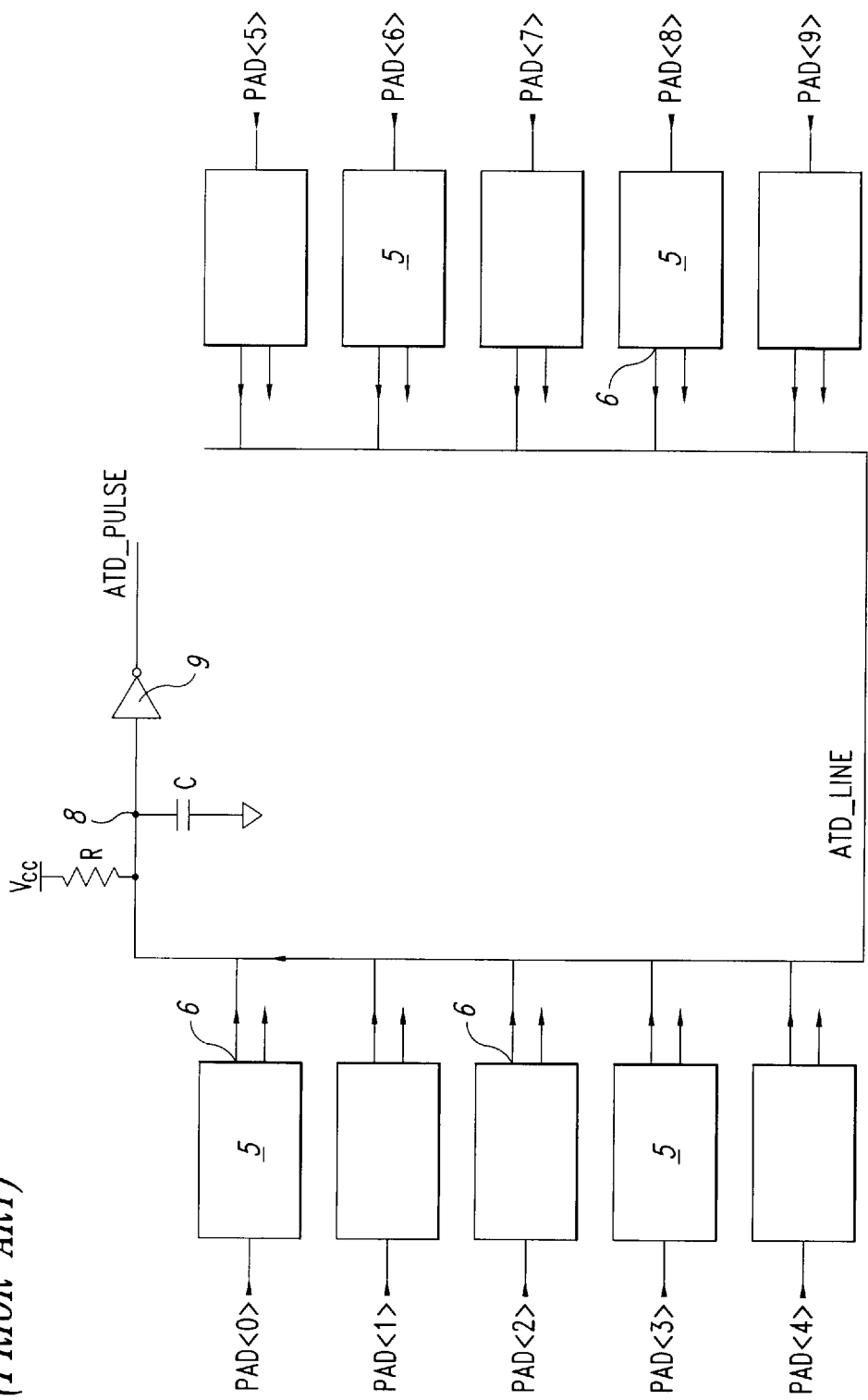
FIG. 3 shows schematically a second circuit proposal from the prior art for generating an ATD signal.

These transistors have their respective control terminals connected together and in common with the control terminal of an N-channel MOS transistor MN1 placed between the node 12 and a second voltage supply reference, such as a ground GND. All of the above control terminals are connected to the line ATD-LINE on which a signal enabling the generation of the ATD pulse is presented. It should be appreciated that the ATD-Line can be either of the lines labeled ATD-Line in FIGS. 1 and 3.

A P-channel MOS transistor MP4 connects the node 12 to the first voltage supply reference, and a capacitor C connects the node 12 to the ground GND.

The ATD pulse synchronization signal is obtained from the node 12.

The node 12 is connected to the input of a logic gate 16 of the OR type with two inputs. The second input of the gate 16 receives a standby signal STBY which is the equivalent of a low logic value. In essence, it is as if this second input of the gate 16 were held at ground potential.

The OR gate 16 has an output connected to an input of a logic gate 17 of the NAND type with two inputs. The other input of the NAND gate 17 is applied a signal FORCEATDN which corresponds to a high logic value. In essence, it is as if the second input of the NAND gate 17 were held at the same potential as the supply Vcc.

The logic gate 17 has an output connected to the input of an inverter 18. The output of the inverter 18 is connected to the input of another inverter 19 and branches off toward a re-acknowledge circuit portion 15, described herein below.

The inverter 19 output delivers the equalization signal EQLZ for the sense amplifier.

In this invention, the output from the inverter 18 is advantageously the input of the re-acknowledge circuit portion 15 which comprises a monostable delay line 20 and a logic gate 21 of the NOR type with two inputs.

The input signal to the portion 15, as provided by the output from the inverter 18, is applied to one of the logic NOR gate 21 inputs. The other input of the logic gate 21 receives the same signal through the delay line 20 comprised of a series of three inverters I1, I2, I3. A capacitor Cc is placed, toward ground, between the output of the first inverter I1 and the input of the second inverter I2.

The logic NOR gate 21 has an output connected directly to the control terminal of an N-channel MOS transistor denoted by MNX and serving a pull-down function.

This transistor MNX has its source terminal connected to ground, GND, and its drain terminal connected to the ATD output node 12 at the first input of the logic OR gate 16.

Advantageously, the transistor MNX has been selected with large dimensions so that it can discharge the node 12 to ground fairly rapidly. Illustratively, the transistor MNX can bias the node 12 to ground within an equivalent time to those to be obtained normally in the presence of a concurrent switching of all of the n address input terminals or PADs.

Briefly stated, the structure of the circuit portion 15 is input a signal corresponding to the equalization signal EQLZ, and is feedback connected to said AT output node 12 to drive the discharging of the node 12 with a predetermined delay from reception of the input signal.

The main phases of the method according to the invention will now be reviewed in detail, from an initial state where at least one switching of the logic state of one of the address input terminals or PADs has occurred.

The transistors MP1, MP2 and MP3 are highly resistive, and hence, hardly conductive. The transistor MP4 is always 'on' and holds the output node 12 of the circuit 1 at a high logic level during a static condition, in co-operation with the stabilizing capacitor C.

Figure 5A:
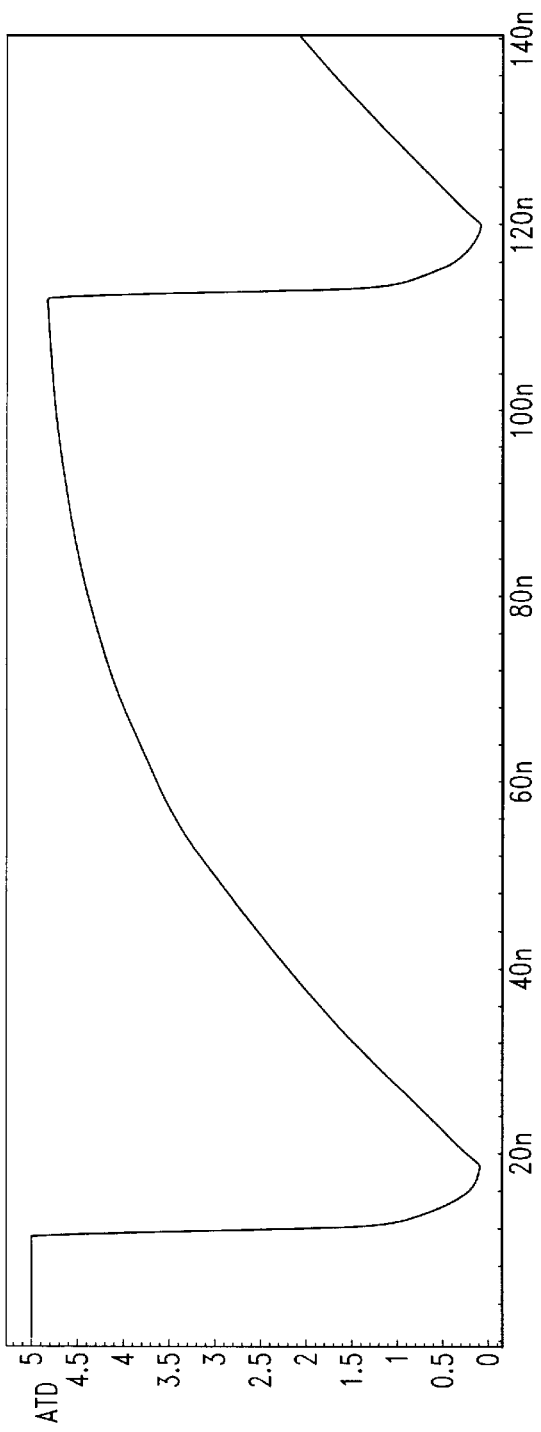
FIGS. 5A and 5B show, on respective voltage (V) vs. time (ns) graphs, plots of the ATD and equalization EQLZ signals present in the generator circuit of FIG. 4.

The signal ATD-LINE becomes high as the result of a change in level occurring on any of the address inputs; thereby turning on transistor MN1 on and turning off the resistive PMOS transistors. This allows the generation of an ATD pulse which has a falling edge toward a low logic level as shown in FIG. 5A.

At this point, the ATD output node 12 is low, and therefore, so is also the input of the logic gate 16, which will output a low value for the input of the NAND gate 17.

The gate 17 output goes high, and therefore, the output of the inverter 18 is low.

Figure 5B:
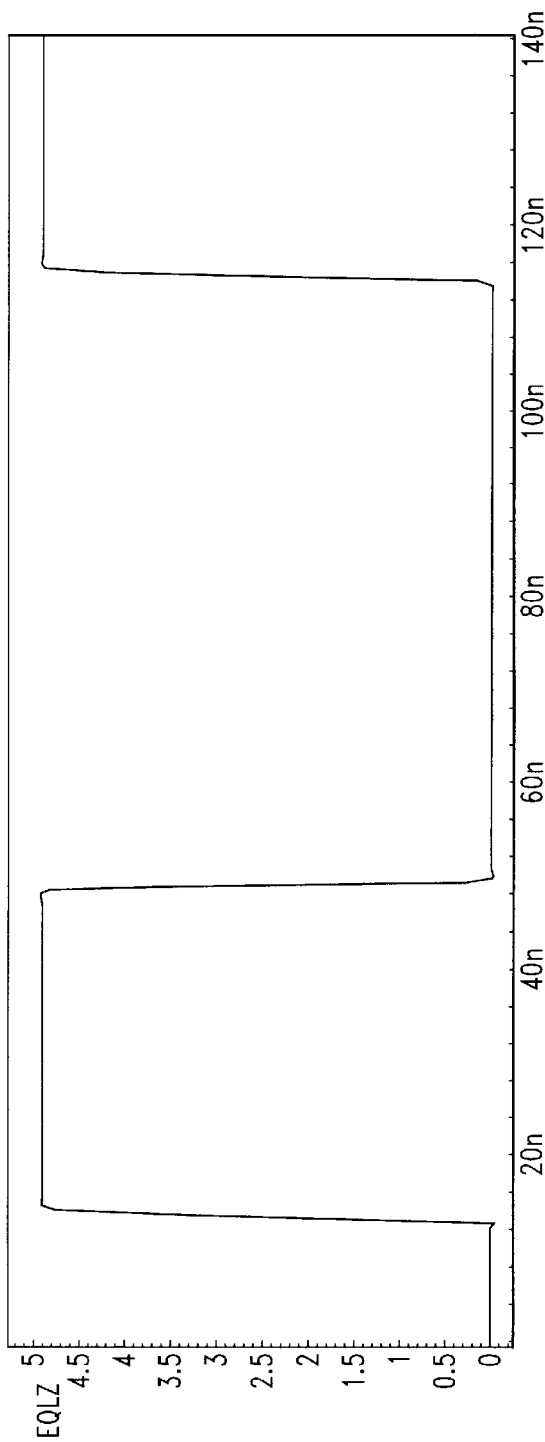

The equalization pulse EQLZ is generated at the output of the inverter 19 with a rising edge toward the high logic level, as shown in FIG. 5B.

The input of the re-acknowledge circuit portion 15 is low, because it is derived from the output of the inverter 18. Consequently, the output of the logic NOR gate 21 will go to a high logic level.

This allows the discharge transistor MNX to be turned on, thereby holding the ATD output node 12 low. After a predetermined time delay set by the delay line 20, the output of the NOR gate 21 will go to a low logical level and turn off the transistor MNX.

As highlighted by the comparative plots of FIGS. 5A and 5B, even in the event of the ATD pulse presenting a spurious level transition due to the appearance of noise, for example, the equalization pulse would be unaffected by this phenomenon, and would retain a sufficient duration to correctly complete a reading phase. All this because the circuit portion 15 substantially allows the ATD pulse to be re-acknowledged even when this pulse is generated by a spurious input switching.

The method and circuit of this invention do solve technical problems of the prior art devices and afford a number of advantages, such as:

a stable pulse duration, and hence, uniform memory access times;

substantial unaffection by spurious pulses due to noise, which no longer interfere with the completion of a correct data reading from the memory; and independence of the number of the address input terminals which are switched.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for generating a pulse synchronization signal in order to control the reading phase of memory cells in semiconductor integrated electronic memory devices, being of the type wherein said pulse synchronization signal is generated upon sensing a change in a logic state on at least one of a plurality of address input terminals of said memory cells to also generate an equalization signal for a sense amplifier, characterized in that the logic state of said pulse signal is re-acknowledged using a fed-back response having a predetermined delay and being generated upon reception of a corresponding signal to said equalization signal.

2. A circuit for generating a pulse synchronization signal to control the reading phase of memory cells of semiconductor integrated electronic memory devices, being of the type which is linked operatively to the occurrence of a change in logic state on at least one of a plurality of address input terminals of said memory cells, and comprising a structure of the NOR type placed between said address terminals and an output node whence an equalization signal is obtained for a sense amplifier, characterized in that the circuit comprises a re-acknowledge circuit portion which is input a signal corresponding to said equalization signal and is feedback connected to said output node to drive the discharging of said output node with a predetermined delay from the reception of the input signal.

3. A circuit according to claim 2, characterized in that said re-acknowledge circuit portion comprises a logic gate, and a delay line, the logic gate including a first input that directly receives the signal applied to the re-acknowledge portion input and a second input that receives the same signal through said delay line.

4. A circuit according to claim 3, characterized in that said delay line comprises a set of inverters.

5. A circuit according to claim 3, characterized in that said re-acknowledge circuit portion further comprises a discharge transistor connected between said output node and a voltage reference at a low logic level, said transistor having a control terminal connected to the output of said logic gate.

6. A circuit according to claim 5, characterized in that said transistor (MNX) is of the NMOS type having a source terminal connected to ground.

7. A circuit according to claim 2, characterized in that the signal applied to the input of said re-acknowledge circuit portion is the negated equalization signal.

8. A circuit according to claim 2, characterized in that said discharging is enabled with a delay from a rising edge of the equalization signal.

9. A circuit for generating a pulse synchronization signal for reading a memory device, comprising:

an input line having a logic state;

an output line having a logic state that temporarily inverts responsive to a change in the logic state of the input line;

a re-acknowledge circuit portion that maintains the output line in the inverted logic state for a predetermined time period responsive to the inversion of the logic state of the output line.

10. The circuit of claim 9 wherein the re-acknowledge circuit portion includes a logic gate having a first input directly coupled to a signal line having a logic state responsive to the logic state of the output line, a second input coupled to the signal line via a delay line, and an output that switches from a first logic state to a second logic state in response to the inversion of the logic state of the output line and switches back to the first logic state after a predetermined time period determined by the delay line.

11. The circuit of claim 10 wherein the delay line includes a set of inverters.

12. The circuit of claim 10 wherein the logic gate is a NOR logic gate whose output switches to a high logic state in response to the inversion of the logic state of the output line and switches back to a low logic state after a predetermined time period determined by the delay line.

13. The circuit of claim 10 wherein the re-acknowledge circuit portion further includes a transistor having a first terminal connected to the output line, a second terminal connected to a voltage reference, and a control terminal connected to the output of the logic gate, the transistor being of a type that turns on to electrically connect the output line to the voltage reference when the output of the logic gate is at the second logic state and turns off to electrically disconnect the output line from the voltage reference when the output of the logic gate is at the first logic state.

14. The circuit of claim 13 wherein the transistor is a discharge transistor with its second terminal connected to ground.

15. The circuit of claim 9, further comprising an output logic gate coupled to the output line, the inverter outputting an equalization signal to a sense amplifier in response to the inversion of the logic state of the output line.

16. The circuit of claim 9, further comprising:

a plurality of address input terminals coupled to the input line, the logic state of the input line changing in response to a change in logic state of any one of the plurality of address input terminals.

17. The circuit of claim 16, further comprising:

a pulse generating circuit coupled between the plurality of address input terminals and the input line, the pulse generating circuit changing the logic state of the input line in response to a change in logic state of any one of the plurality of address input terminals.

18. The circuit of claim 16, further comprising:

a plurality of output stages each coupled to a respective one of the address input terminals, each output stage changing the logic state of the input line from a first logic state to a second logic state in response to its respective address input terminal changing from the first logic state to the second logic state or from the second logic state to the first logic state.

19. The circuit of claim 9, further comprising:

a first transistor coupled between a first voltage reference of a high logic state and the output line such that the output line has a high logic state during a static condition; and a second transistor having a first terminal coupled to a second voltage reference of a low logic state, a second terminal coupled to the output line, and a control terminal coupled to the input line such that the output line is electrically coupled to the second voltage reference through the second transistor in response to the change in the logic state in the input line.

20. The circuit of claim 19, further comprising:

a third transistor having a first terminal coupled to the first voltage reference, a second terminal coupled to the output line, and a control terminal coupled to the input line, the third transistor being of an opposite conductivity type compared to the second transistor such that the third transistor switches off in response to the change in the logic state in the input line.

* * * * *